Oct. 22, 1963 S. A. BUTLER ET AL 3,108,218

TUNNEL DIODE CONTROLLED TRANSISTOR REGULATOR

Filed June 30, 1960 2 Sheets-Sheet 1

INVENTORS
SAMMY A. BUTLER
HANNON S. YOURKE
BY Frank Chadurjian
ATTORNEY

United States Patent Office 3,108,218
Patented Oct. 22, 1963

3,108,218
TUNNEL DIODE CONTROLLED TRANSISTOR REGULATOR

Sammy A. Butler and Hannon S. Yourke, Peekskill, N.Y., assignors to International Business Machines Corporation, New York, N.Y., a corporation of New York
Filed June 30, 1960, Ser. No. 39,990
6 Claims. (Cl. 323—22)

This invention relates to semiconductor circuits employed as voltage regulators and amplifiers and more specifically to voltage regulators and amplifiers employing a feedback loop in which a standard is employed for comparison purposes and in which the characteristics of an Esaki diode are utilized as the standard.

An article in the Physical Review of January 1957, on pages 603–605, entitled "New Phenomenon in Narrow Germanium P-N Junctions," by L. Esaki, describes a semiconductor structure which has come to be known as the "Esaki diode," sometimes alternately referred to in the literature and herein as a "tunnel diode." As described by Esaki, the diode is a PN junction device in which the junction is very thin, i.e., narrow, in the currently accepted terminology (on the order of 150 angstrom units or less), and in which the semiconductor materials on both sides of the junction have high impurity concentrations (on the order of $10^{-19}$ net donor or acceptor atoms per cubic centimeter for germanium).

The tunnel diode is characterized by a very low reverse impedance, approaching a short circuit, with a forward potential-current characteristic exhibiting a negative resistance region beginning at a small value of forward potential (on the order of 0.05 volt) and ending at a large forward potential (on the order of 0.2 volt). The potential value of the low potential end of the negative resistance region is very stable with respect to temperature and does not vary over a range of temperatures from a value near zero degrees K. to several hundred degrees K. At potential values outside the limited range described above, forward resistance of the tunnel diode is positive. The tunnel diode is then considered to be a diode exhibiting an N shaped characteristic curve for a plot of current versus potential. For a more complete understanding of the structure and operational characteristics of the tunnel diode, reference is made to an article appearing in the Proceedings of the IRE, July 1959, pages 1201–1206, entitled "Tunnel Diodes as High Frequency Devices," by H. S. Sommers, Jr.

The "tunnel" diode may then be said to be a P-N junction diode wherein both the P region and the N region contain a very high concentration of their respective impurities resulting in a current versus voltage characteristic which exhibits a short circuit stable negative resistance region. This characteristic may also be defined as exhibiting a first region of positive resistance over a low range of potentials and adjoining at a peak current value a second region of negative resistance and thence a third region of positive resistance.

By utilizing a tunnel diode in a circuit wherein the diode is biased in the first positive resistance region to provide monostable operation, a multivibrator circuit is realized. Upon receipt of excess current, the tunnel diode is forced into a cycle of oscillation. If the current received in such a circuit is sustained for a period of time, the tunnel diode is biased in the negative resistance region and operates similar to an oscillator. Thus, the tunnel diode is made to operate at a variable frequency rate dependent upon the duration and the frequency of variations of excess currents thereto.

Construction of novel voltage regulator circuits and amplifiers is then achieved by employing the above phenomena. A voltage regulator having an input terminal and an output terminal for providing a regulated voltage at the output terminal regardless of variations in voltage magnitude of a source connected to the input terminal thereof is constructed by connecting a first impedance element intermediate the input and output terminals of the regulator, a first and a second circuit is provided connected in parallel with one another and in series with said impedance. The said first circuit includes a multivibrator for providing a variable rate of oscillations determined by the magnitude of current applied thereto, and the said second circuit comprises a controllable impedance element. In addition, means are provided interconnecting said first and second circuits for translating the rate of oscillations of said multivibrator and controlling the impedance of said second circuit whereby the current from the first impedance element is controlled to provide a voltage drop thereacross which insures a regulated voltage at the output terminal of said circuit.

More specifically, a voltage regulator is constructed in accordance with the teachings of this invention by connecting an impedance element intermediate the input and output terminals of the regulator and providing means coupled to the impedance for comparing the current therethrough with a standard and providing control thereof whereby the voltage drop across said impedance element is controlled to insure a regulated voltage at the output terminal of said regulator. The comparing means includes a current driven device exhibiting a current-voltage characteristic defining a first region of positive resistance over a low range of potentials having a predetermined standard current value therein and adjoining at a peak current value a second region of negative resistance and thence a third region of positive resistance for comparing the current therethrough with the predetermined current value of said first region. When the current therethrough exceeds said predetermined value, said device oscillates at a variable rate dependent upon the energization thereof by said source. Also, means are provided coupled to said device and said impedance element for translating the rate of oscillations of said device to control the current through said impedance element.

Accordingly, it is a prime object of this invention to provide novel voltage regulators and amplifiers.

A more specific object of this invention is to provide novel voltage regulators and amplifiers employing tunnel diodes.

Another object of this invention is to provide novel voltage regulators and amplifiers wherein the resistance characteristics of a tunnel diode are employed as a reference.

Yet another object of this invention is to provide a voltage regulator and an amplifier wherein the impedance of an alternate current path is controlled to regulate current through a fixed resistance which in turn controls the voltage drop thereacross.

The foregoing and other objects, features and advantages of the invention will be apparent from the following more particular description of preferred embodiments of the invention, as illustrated in the accompanying drawings.

Figure 1:
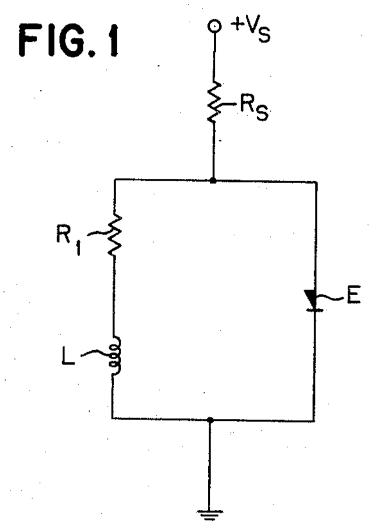
FIG. 1 is a schematic of a tunnel diode multivibrator circuit.

Referring to the circuit of FIG. 1, a basic negative

Figure 3:
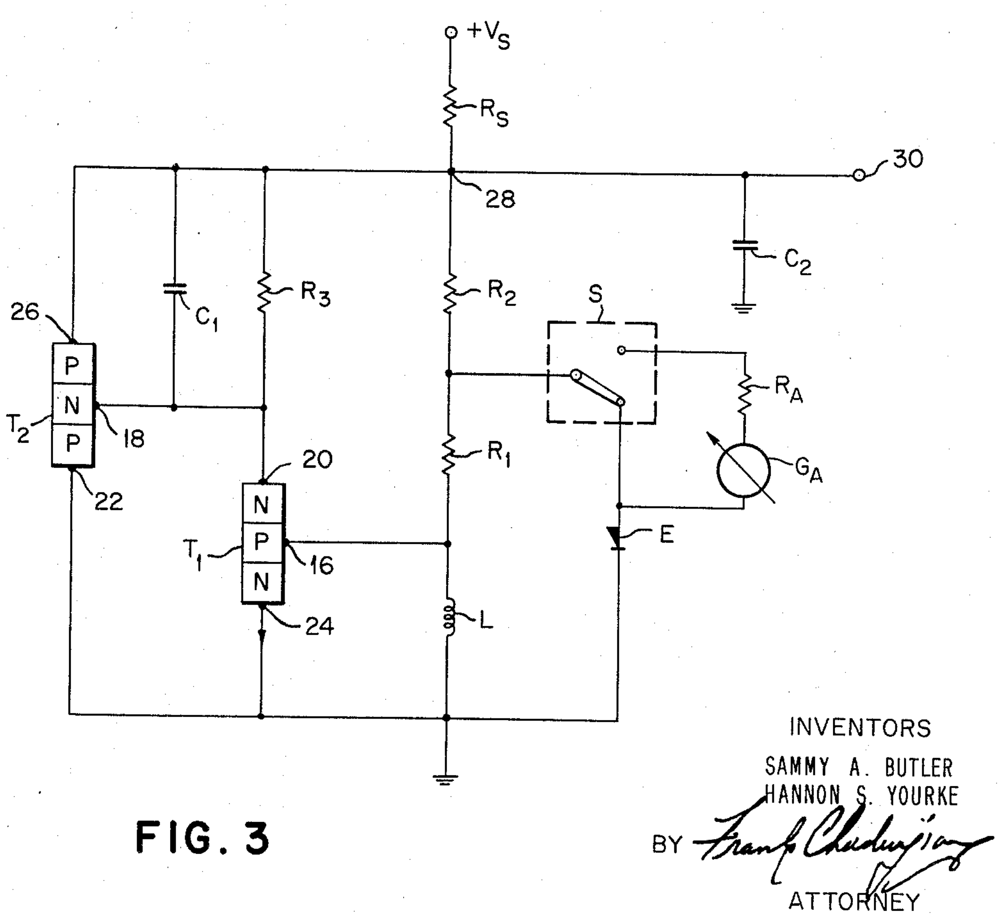
FIG. 3 is a schematic of one embodiment of this invention.

In the embodiment of FIG. 3, with the source $V_s$ supplying approximately 12 volts, the resistors $R_s$, $R_1$, $R_2$ and $R_3$ may have the values of 390 ohms, 10 ohms, 390 ohms and 330 ohms, respectively; the capacitors $C_1$ and $C_2$ may have the values of 1 microfarad and 2 microfarads, respectively. The inductor L may be of 82 microhenries and the Esaki diode providing of 5:1 peak to valley ratio where the peak current value is 5 milliamperes at a value of approximately 0.45 millivolt. The transistors $T_1$ and $T_2$ may be of the germanium alloy junction type having a frequency cut off of five megacycles with a power dissipation of 55 millwatts and a breakdown voltage of 20 volts collector to base.

Figure 2:
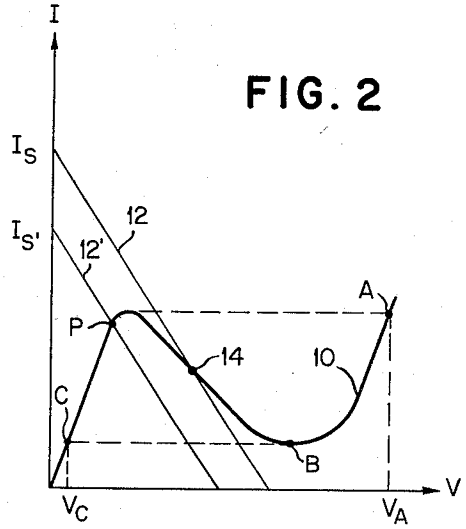
FIG. 2 illustrates the characteristics of the tunnel diode employed in the circuit of FIG. 1.
Figure 4:
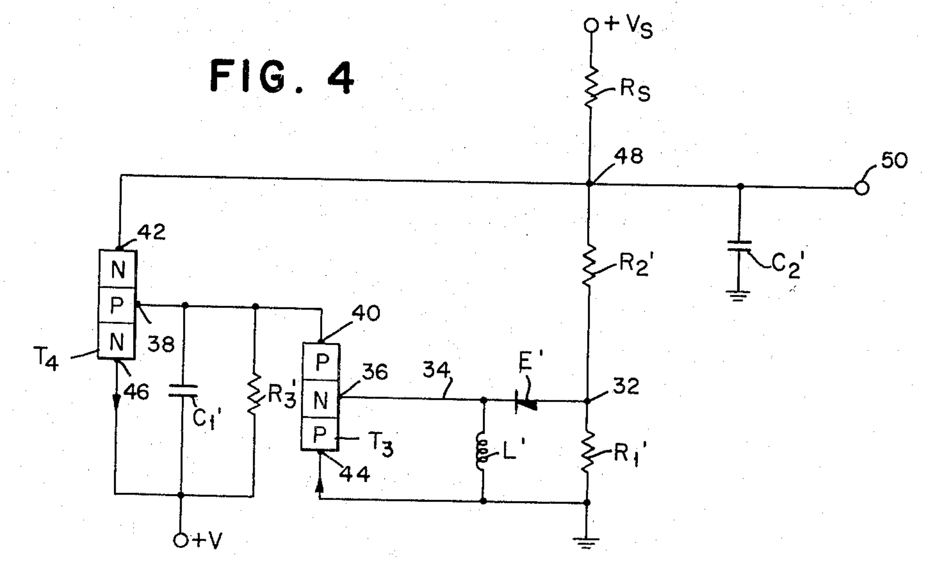
FIG. 4 is a schematic of another embodiment of this invention.

Referring to the FIG. 4, another embodiment of this invention is shown wherein regulation is again provided by control of a passive element. There is provided another form of the multivibrator circuit of FIG. 1 wherein a diode E′ is serially connected to an inductor L′ and this combination is connected to a terminal 32 and in parallel with a resistor $R_1'$. Ontputs of the multivibrator circuit are taken across the inductor L′ by means of an output line 34 connected intermediate the diode E′ and inductor L′. In this embodiment, the output pulses obtained across the inductor L′ are negative going impulses since the Esaki E′ is connected as shown. When the diode E′ is operating at point P in FIG. 2, a small voltage drop appears thereacross, while the remainder appears across the inductor L′. When the diode E′ is triggered to go through an oscillation cycle as described above, the voltage across the diode E′ increases to the value $V_A$ to provide a negative voltage change across the inductor L′.

Connected to the output line 34 of the multivibrator circuit is another form of a frequency metering circuit comprising a PNP transistor $T_3$, an NPN transistor $T_4$, and an integrating network comprising a resistor-capacitor combination $C_1'$ and $R_3'$. The transistors $T_3$ and $T_4$ include base electrodes 36 and 38, respectively, collector electrodes 40 and 42, respectively, and emitter electrodes 44 and 46, respectively. The emitter 44 of $T_3$ is connected to ground while the emitter 46 of $T_4$ is connected to a voltage source $-V_c$. The output line 34 is connected to the base 36 of $T_3$ to cause conduction thereof when a negative voltage charge appears across L′. The collector 40 of $T_3$ reflects the conduction thereof to provide a positive voltage pulse to the integrating network $C_1'$ and $R_3'$ connected thereto for each change appearing across the inductor L′. The integrating network in turn is connected across the emitter 46 and base 38 of $T_4$ to provide conduction of $T_4$ and draw current into its collector 42. The collector 42 of $T_4$ is connected to a terminal 48. The terminal 48 receives the source input $+V_s$ through the resistor $R_s$ connected thereto and is also connected to the terminal 32 through a resistor $R_2'$. Capacitor $C_2'$ is connected from ground to terminal 48. The output for the circuit is taken across the capacitor $C_2'$ at terminal 50.

Operation of the circuit of FIG. 4 is similar to that of FIG. 3, in that, depending upon the source $+V_s$, a certain repetition rate of oscillation takes place in the diode E′ and, for each cycle of operation of the diode $E_1$, $T_3$ is turned ON and OFF to provide a train of impulses to the integrating network $R_3'$ and $C_1'$ which biases $T_4$ to a certain degree of conduction. Accordingly, current is drained from the terminal 48 providing a substantially stable voltage at this terminal which is smoothed out by $C_2'$ and appears at the terminal 50. It may be seen that by providing an additional capacitor from ground to the terminal 32, an output may be taken thereacross which is also substantially constant but of a smaller magnitude due to the voltage drop across $R_2'$.

Figure 5:
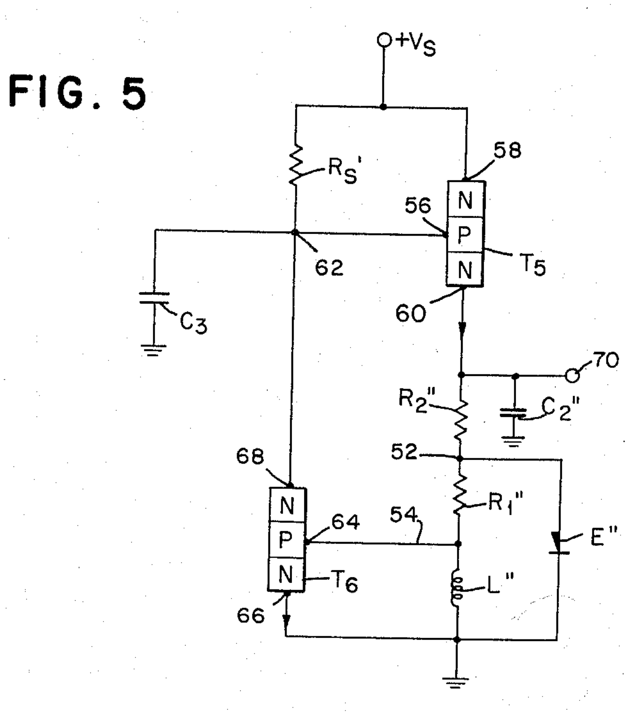
FIG. 5 is a schematic of still another embodiment of this invention.

Referring now to the FIG. 5, another embodiment of this invention is shown, wherein regulation is performed by control of an active element. In the FIG. 5, the basic multivibrator circuit shown in the FIG. 1 includes diode E″ connected to a terminal 52 and in parallel with resistor $R_1''$ and inductor L″. An output line 54 is provided for the multivibrator circuit connected across L″ which provides a positive voltage impulse for each cycle of oscillation of the diode E″. The controlled voltage $+V_s$ is applied directly to resistor $R_s'$ and an NPN transistor $T_5$. The transistor $T_5$ includes a base electrode 56, a collector electrode 58 and an emitter electrode 60. The collector 58 of $T_5$ is connected to $+V_s$ and base 56 to $T_5$ is connected to a terminal 62, as is the resistor $R_s'$. A capacitor $C_3$ is connected from ground to terminal 62, while the emitter 60 of $T_5$ is connected to the terminal 52 through a resistor $R_2''$. The output line 54 of the multivibrator circuit is connected to a base electrode of an NPN transistor $T_6$ having an emitter electrode 66 connected to ground and a collector electrode 68 connected to terminal 62.

For each positive pulse on the output line 54, $T_6$ is turned ON which draws current from $C_3$. Therefore, when $T_6$ is turned ON, the capacitor $C_3$ is partially discharged to lower the potential at terminal 62 which lowers the potential at the base 56 of $T_5$ causing $T_5$ to become less conductive. As $C_3$ changes to a more positive potential, more current flows through $R_2''$ to terminal 52 and diode E″ to trigger another oscillation cycle providing an output to turn ON $T_6$ which again discharges $C_3$. Thus, the operation is regenerative until a steady bias is applied to the base 56 of $T_5$ and a regulated voltage output is obtained at a terminal 70 connected intermediate the emitter 60 of $T_5$ and resistor $R_2''$. Here, regulation of the voltage at terminal 70 is achieved by regulation of the source $+V_s$ rather than controlling of the load current as provided in the embodiments of FIGS. 3 and 4.

While the invention has been particularly shown and described with reference to preferred embodiments thereof, it will be understood by those skilled in the art that various changes in form and details may be made therein without departing from the spirit and scope of the invention.

What is claimed is:

1. A voltage regulator having an input terminal and an output terminal adapted to provide a regulated voltage at said output terminal regardless of variations in voltage magnitude of an unregulated source connected to said input terminal comprising a controllable impedance means connected between said input and said output terminals of said regulator, and means connected to said output terminal for controlling said controllable impedance means so as to provide a regulated voltage of predetermined magnitude at said output terminal, said control means including a tunnel diode device connected to said output terminal and exhibiting a current-voltage characteristic defining a first region of positive resistance and adjoining at a peak value a second region of negative resistance and thence a third region of positive resistance, said device operable along said second region when voltages in excess of said predetermined magnitude appear at said output terminal so as to oscillate at a variable repetition rate dependent upon the magnitude of said excess voltage, and frequency metering means coupled to said device and said controllable impedance for controlling said controllable impedance means in accordance with the repetition rate of said device whereby the voltage at said output terminal is maintained at said predetermined magnitude.

2. A regulator as defined in claim 1 wherein said frequency metering means comprises means responsive to said device for generating a pulse upon each oscillation thereof, and means for integrating said pulses thus generated to provide a varying voltage determined by the repetition rate of said oscillations.

3. A regulator as defined in claim 2 wherein said controllable impedance means comprises a semiconductor element having a control electrode coupled to said integrating means, said element exhibiting variable impedance characteristics in accordance with the magnitude of said varying voltage applied to said control electrode thereof.

4. A voltage regulator having an input terminal and an output terminal for providing a regulated voltage of predetermined magnitude at said output terminal regardless of variations in voltage magnitude of an unregulated source connected to said input terminal comprising a first impedance element connected between the input and output terminals of said regulator, a first and a second circuit connected to said output terminal, said first circuit including a multivibrator comprising a tunnel diode device exhibiting a current-voltage characteristic defining a first region of positive resistance and adjoining at a peak current value a second region of negative resistance and thence a third region of positive resistance, said device being operable in said second region when current therethrough exceeds said peak current value, said second circuit comprising a semiconductor transistor element exhibiting a variable impedance characteristic and having a control electrode, and means including an integrating circuit for translating the rate of oscillations of said multivibrator and interconnecting said multivibrator and said control electrode of said semiconductor transistor element, the impedance of said semiconductor transistor element being controlled to maintain the voltage at said output terminal in relationship with said peak current value of said tunnel diode device.

5. A voltage regulator having an input terminal and an output terminal for providing a regulated output voltage of predetermined magnitude at said output terminal regardless of variations in voltage magnitude of an unregulated source connected to said input terminal comprising a first impedance element connected between said input and said output terminals of said regulator, a first and a second circuit connected to said output terminal, said first circuit including a multivibrator comprising a tunnel diode device exhibiting a current-voltage characteristic defining a first region of positive resistance over a low range of potentials and adjoining at a peak current value a second region of negative resistance and thence a third region of positive resistance, current through said tunnel diode device being substantially equal to said peak current value when a voltage of predetermined magnitude is provided at said output terminal, said tunnel diode device operable in said negative resistance region to oscillate at a rate of oscillation dependent upon deviations of said output voltage beyond said predetermined magnitude, said second circuit comprising a semiconductor transistor element exhibiting a variable impedance characteristic and having a control electrode, and frequency metering means for translating the rate of oscillations of said multivibrator to a direct current, said frequency metering means being connected to said multivibrator and said control electrode whereby the voltage at said output terminal is maintained in relationship with said peak current value of said tunnel diode device.

6. Apparatus for generating from an unregulated input signal a controlled output signal of predetermined magnitude comprising an input terminal to which said input signal is applied, an output terminal from which said output signal is supplied, an impedance connected between said input and said output terminals, a comparing circuit connected to said output terminal for providing output signals having a variable repetition rate when said output signal is in excess of said predetermined magnitude comprising a multivibrator circuit including a tunnel diode device exhibiting a current-voltage characteristic defining a first region of positive resistance over a low range of potentials and adjoining at a peak current value a region of negative resistance and thence another region of positive resistance, said tunnel diode device connected in parallel with an inductive impedance and operable in said negative resistance region when said output signal is in excess of said predetermined magnitude, the rate of oscillation being dependent upon the magnitude of current in excess of said peak current value through said tunnel diode device, means connected to said comparing circuit for translating the oscillations produced thereby to a direct current signal having a magnitude dependent upon the rate of oscillation of said comparing circuit, and a variable impedance connected to said output terminal and responsive to said translating means in accordance with said direct current signal for maintaining said output signal at said predetermined magnitude.

References Cited in the file of this patent

UNITED STATES PATENTS

| | | |
|---|---|---|
| Re. 24,671 | Jensen | July 21, 1959 |
| 2,969,498 | Stenudd | Jan. 24, 1961 |
| 2,975,377 | Price et al. | Mar. 14, 1961 |